(12) United States Patent
Kotani et al.

(10) Patent No.: US 6,888,180 B2
(45) Date of Patent: May 3, 2005

(54) HETERO-JUNCTION BIPOLAR TRANSISTOR AND A METHOD FOR MANUFACTURING THE SAME

(75) Inventors: Kenji Kotani, Yokohama (JP); Hiroshi Yano, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 12 days.

(21) Appl. No.: 10/418,291

(22) Filed: Apr. 18, 2003

(65) Prior Publication Data

US 2004/0012036 A1 Jan. 22, 2004

(30) Foreign Application Priority Data

Apr. 19, 2002 (JP) .......................................... 2002-117997

(51) Int. Cl.[7] .......................................... H01L 31/0328
(52) U.S. Cl. .......................................... 257/191; 257/198
(58) Field of Search ................................. 257/198, 191

(56) References Cited

U.S. PATENT DOCUMENTS 5,001,534 A    3/1991   Lunardi et al.
5,949,097 A *  9/1999   Hirata et al. ................ 257/198
6,531,722 B2   3/2003   Yaegashi et al.
6,717,188 B2 * 4/2004   Aoki .......................... 257/191

FOREIGN PATENT DOCUMENTS

JP      10-189616       7/1998
JP      2000-349091     12/2000

* cited by examiner

*Primary Examiner*—John F. Niebling
*Assistant Examiner*—André Stevenson
(74) *Attorney, Agent, or Firm*—Smith, Gambrell & Russell, LLP

(57) ABSTRACT

This invention provides a hetero-junction bipolar transistor (HBT) in which both a base resistance and a base-collector parasitic capacitance are decreased. The HBT has a collector (C) 18, a base (B) 20 and an emitter (E) 26. The collector comprises an outer collector region and an inner collector region, a thickness of the outer collector region is greater than that of the inner region. The base comprises an intrinsic region and an extrinsic region on the outer collector region, while the intrinsic base disposed on the inner collector region. The emitter is disposed on both the intrinsic base and the extrinsic base, and has a band gap energy greater than that of the base.

7 Claims, 17 Drawing Sheets

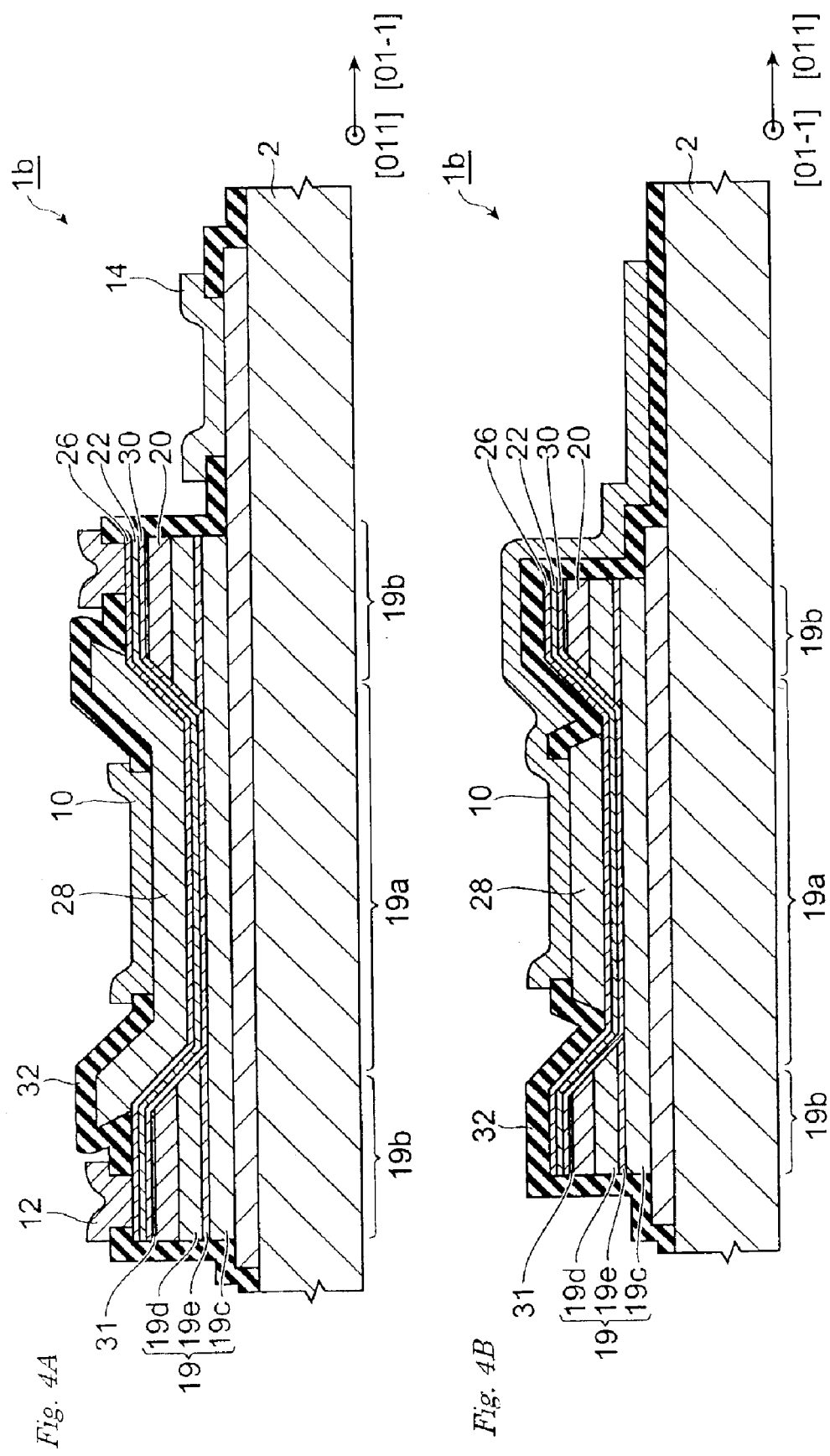

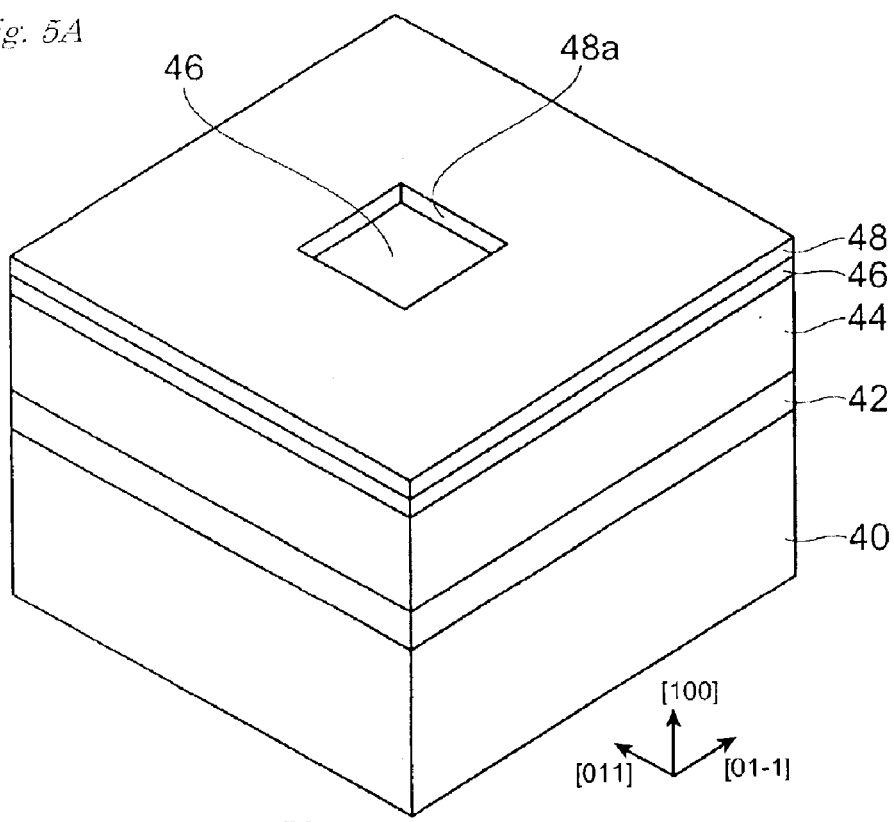
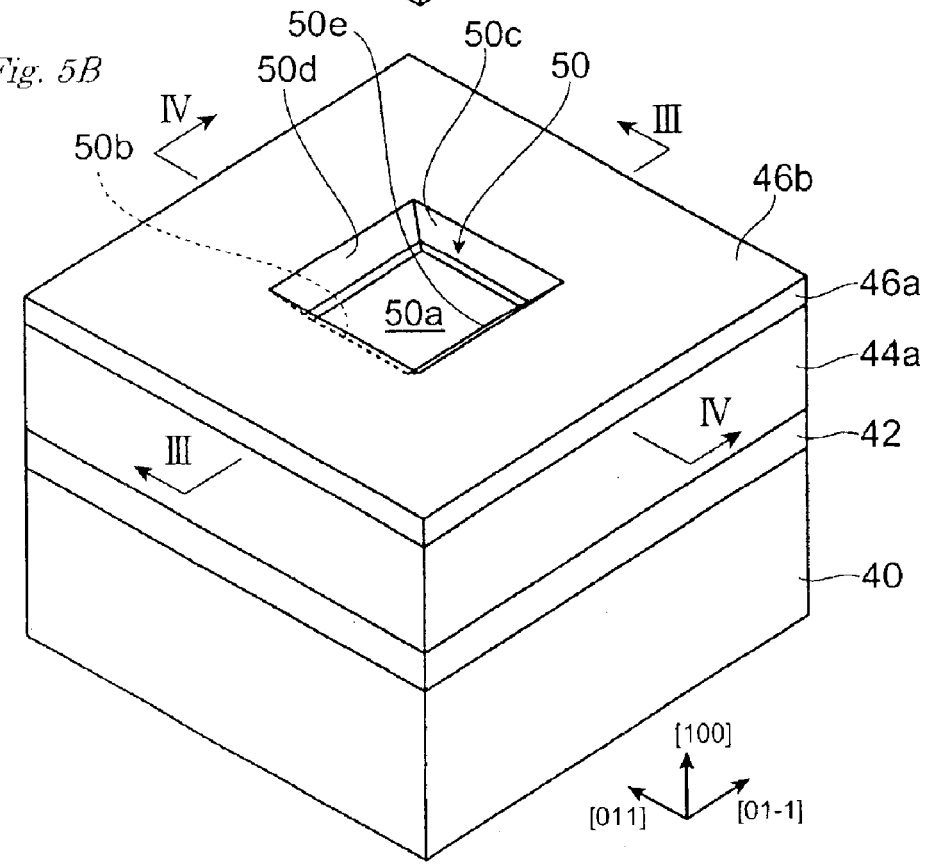

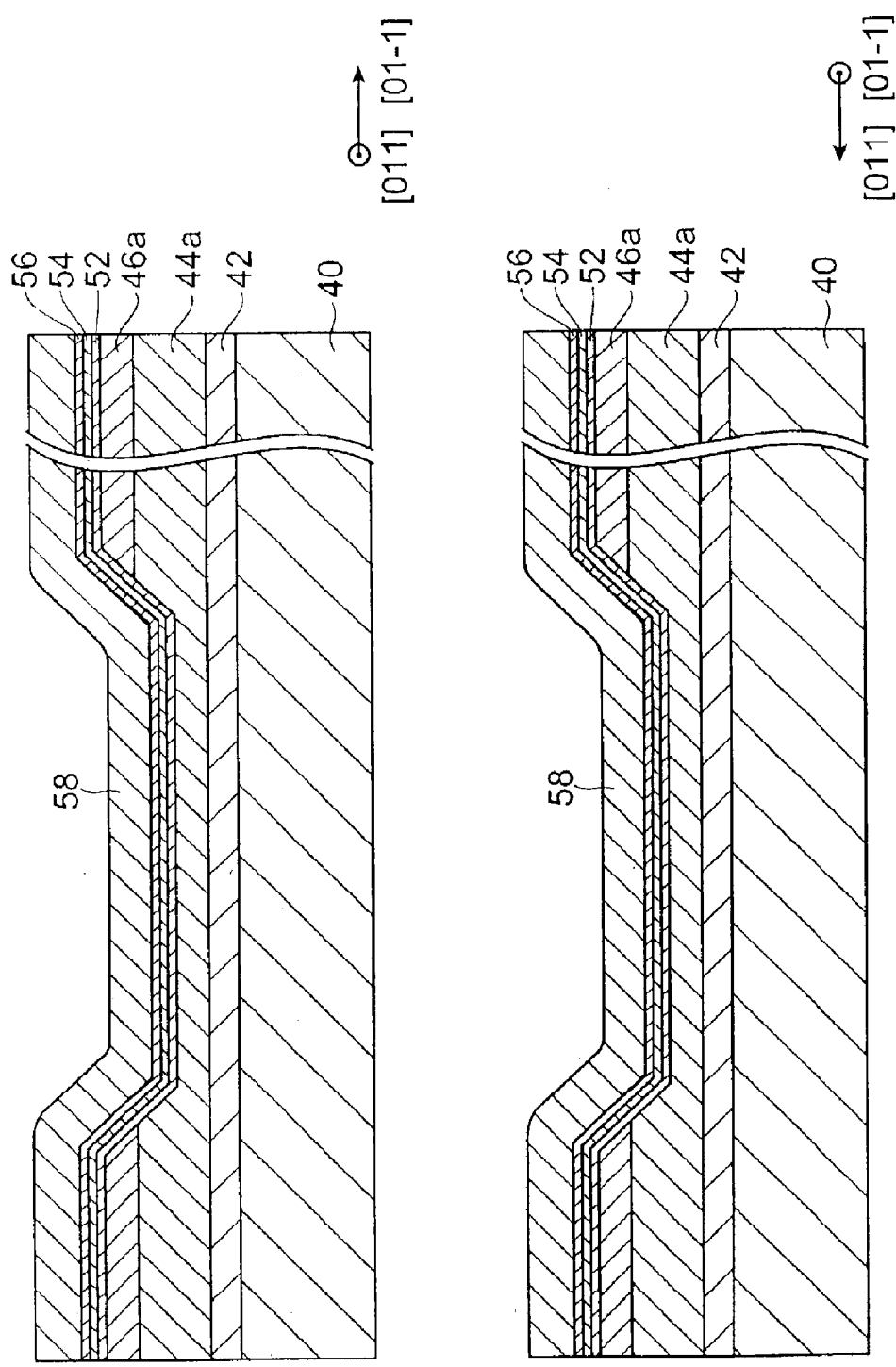

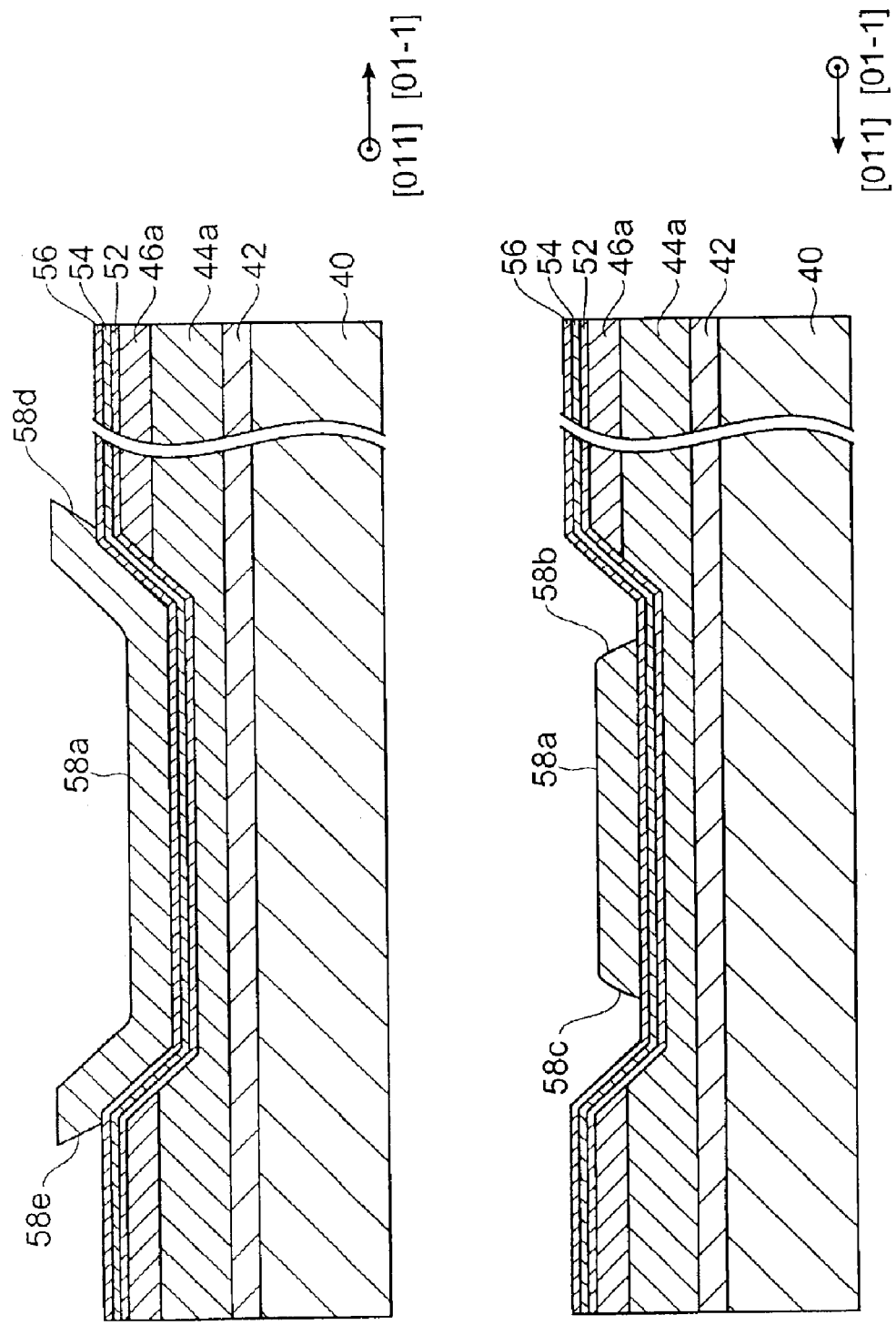

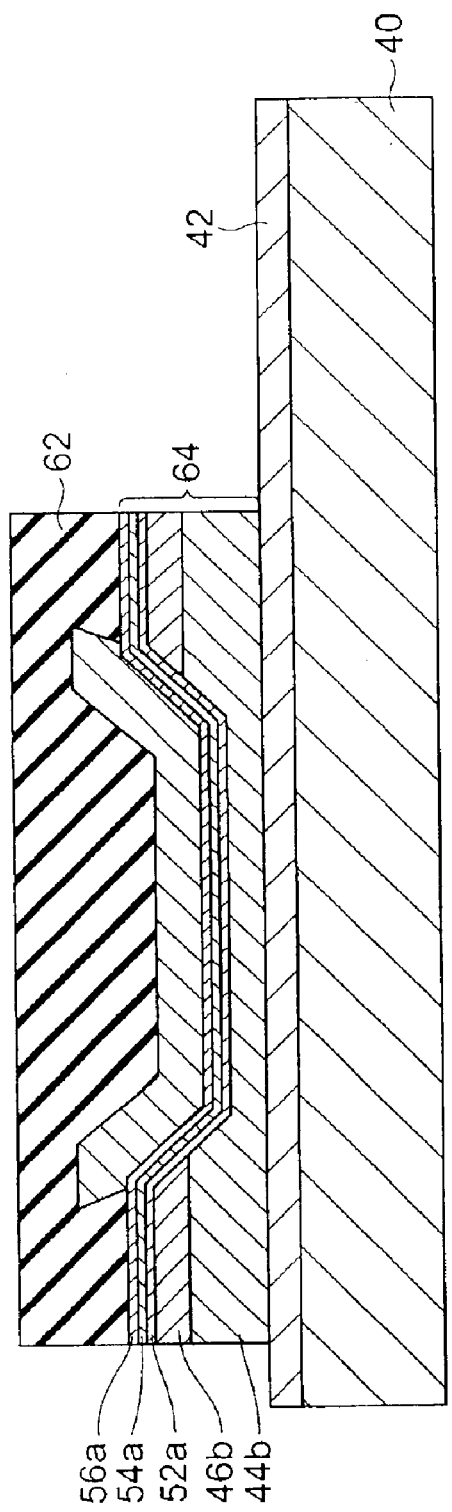
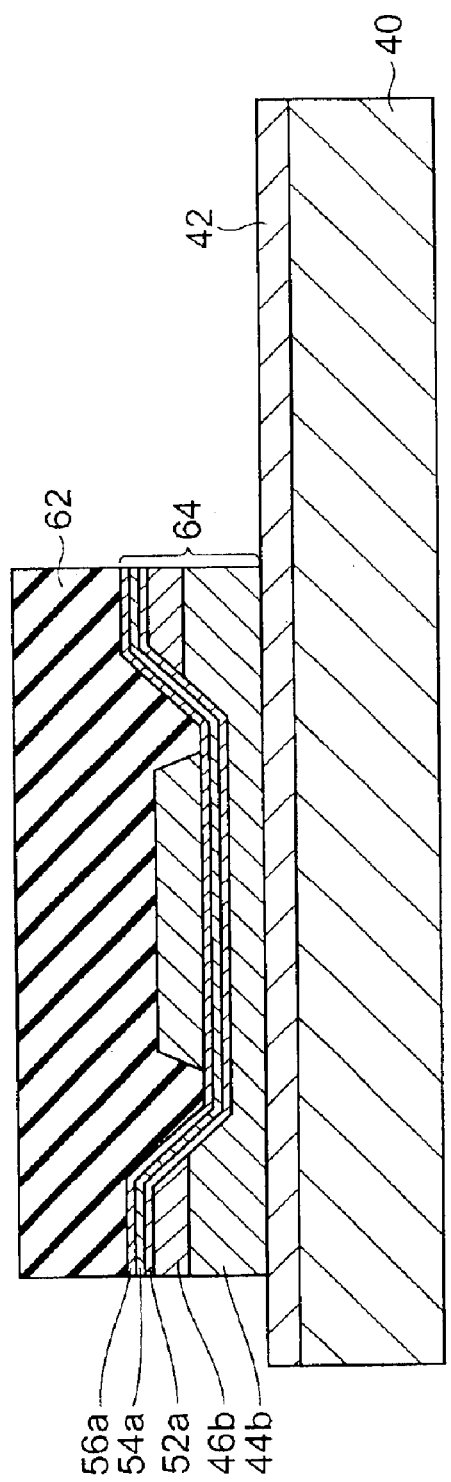
Fig. 12A
Fig. 12B

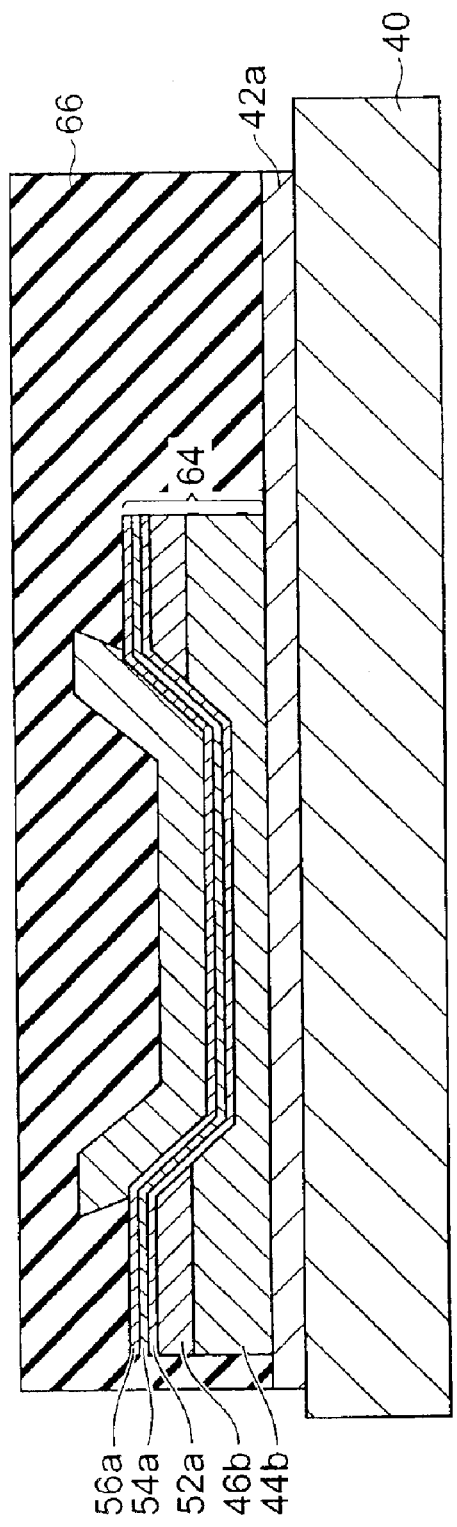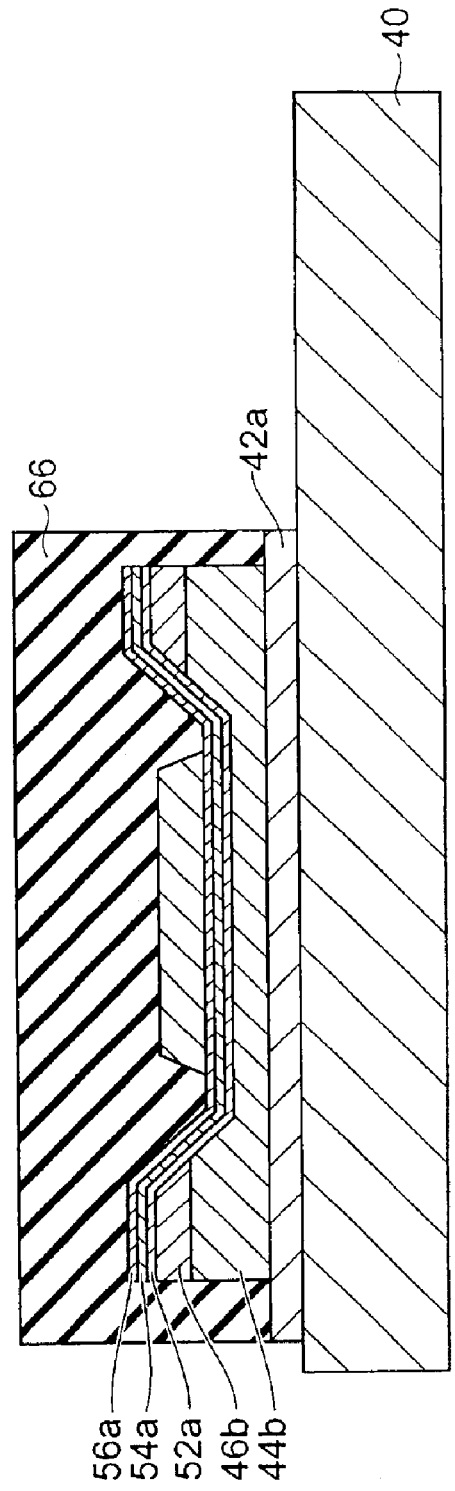

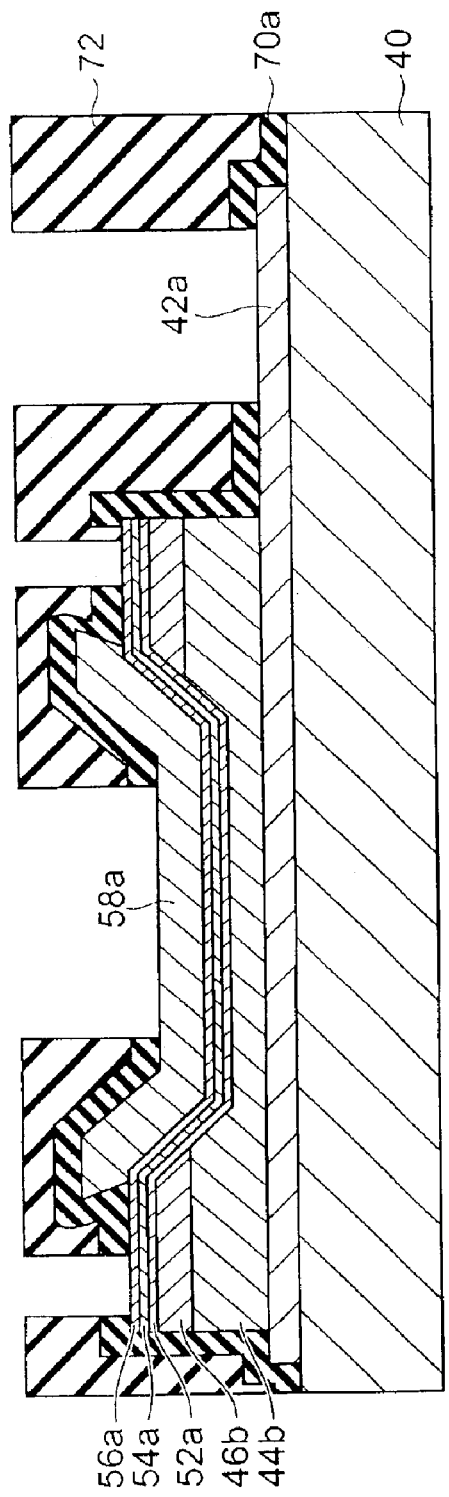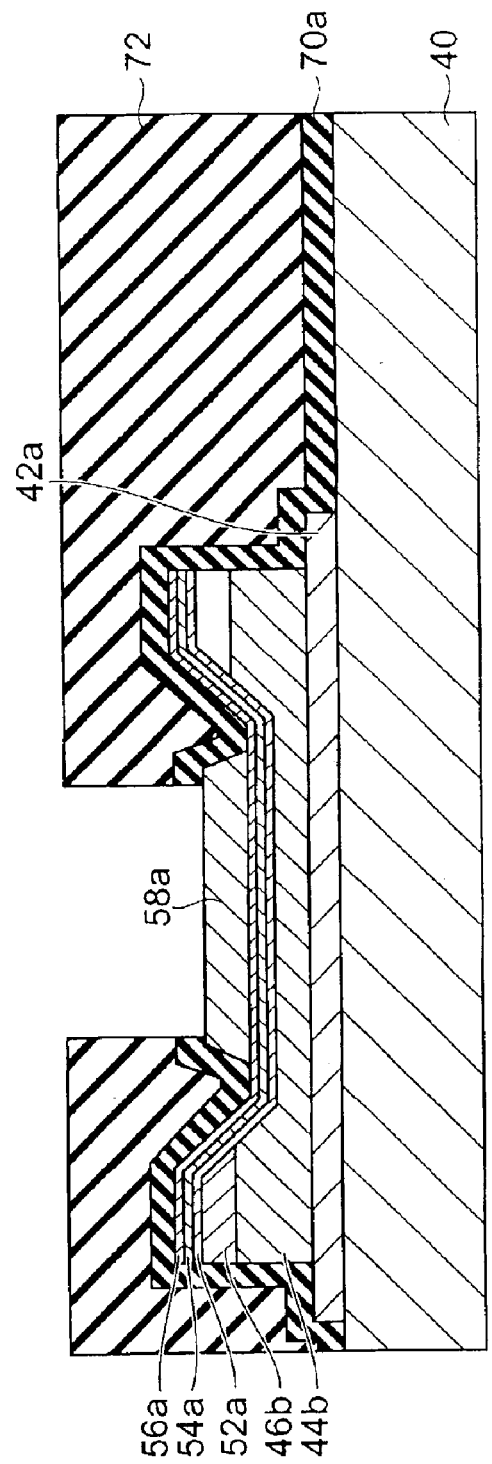
Fig. 14A
Fig. 14B

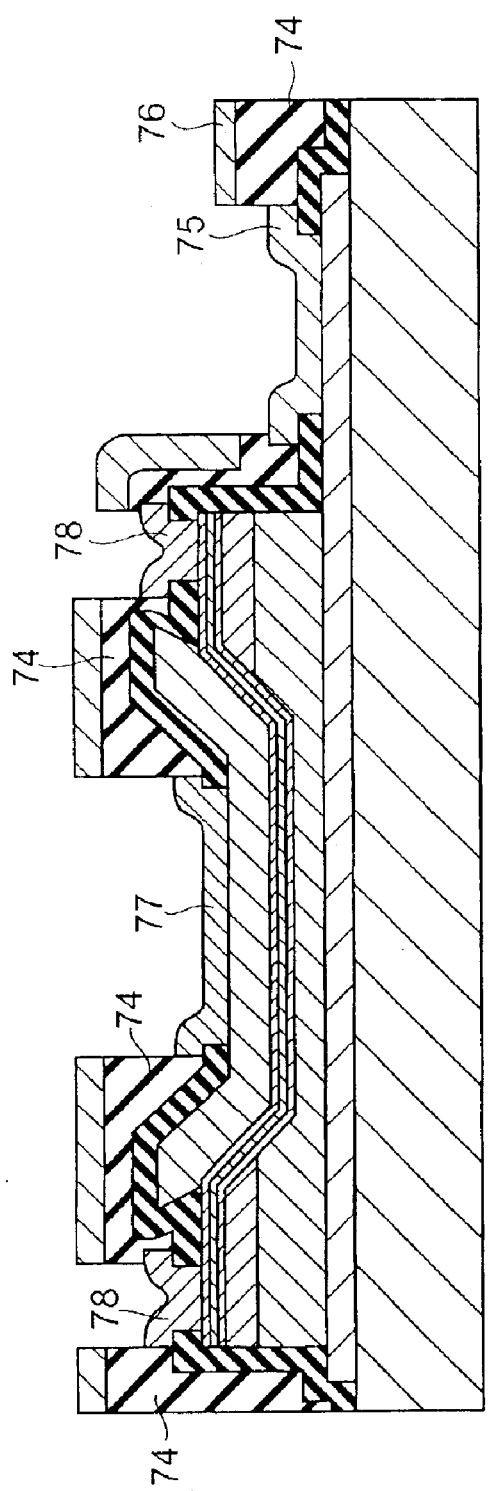
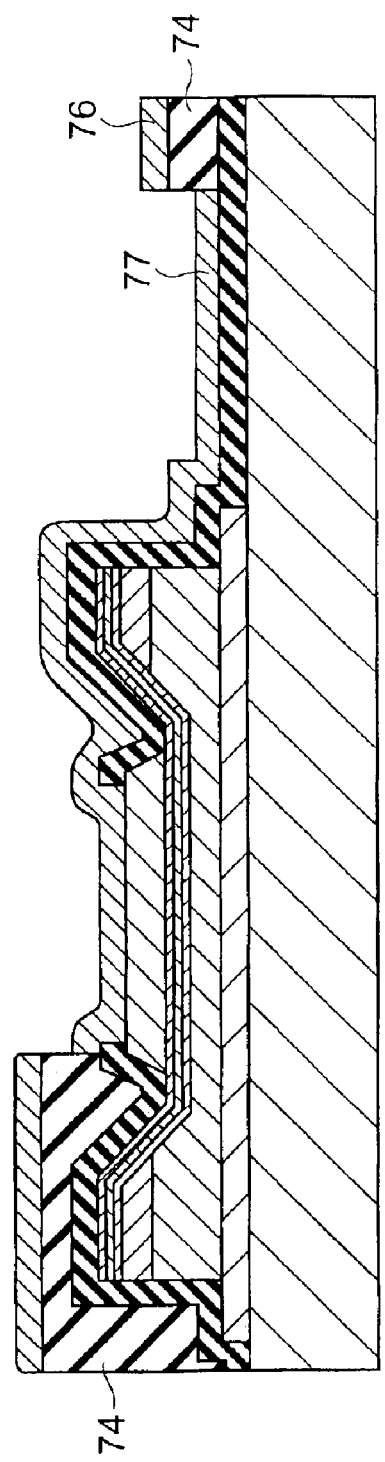
Fig. 15A
Fig. 15B

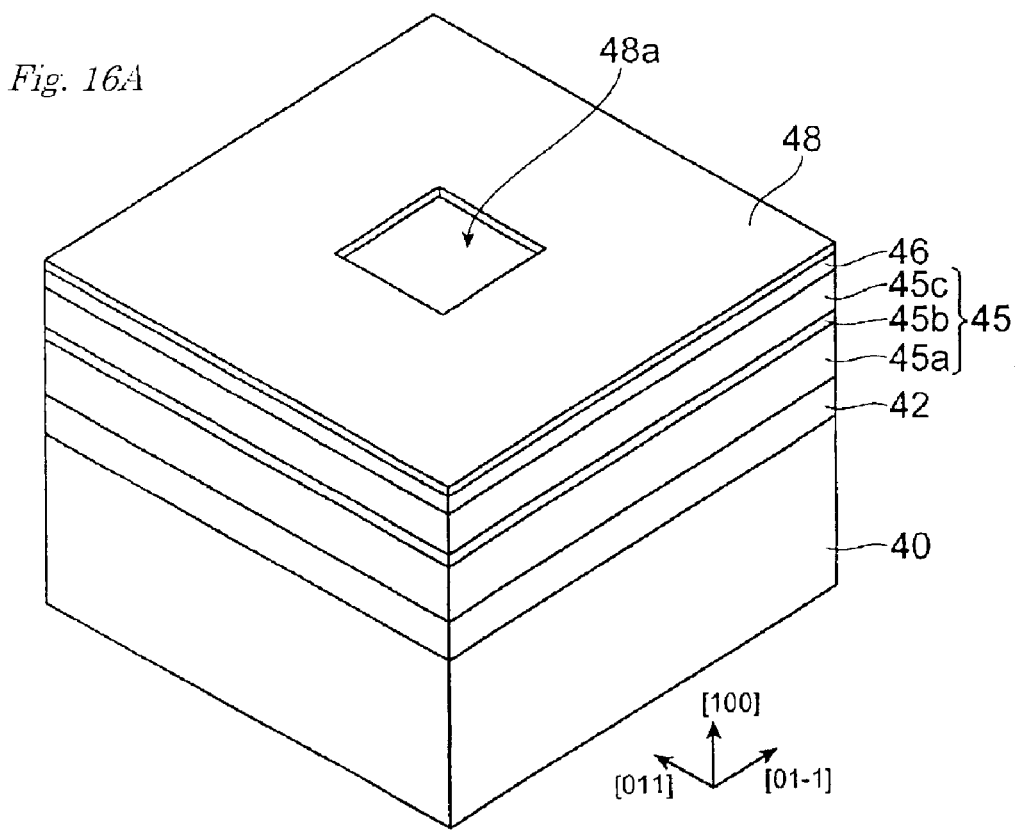
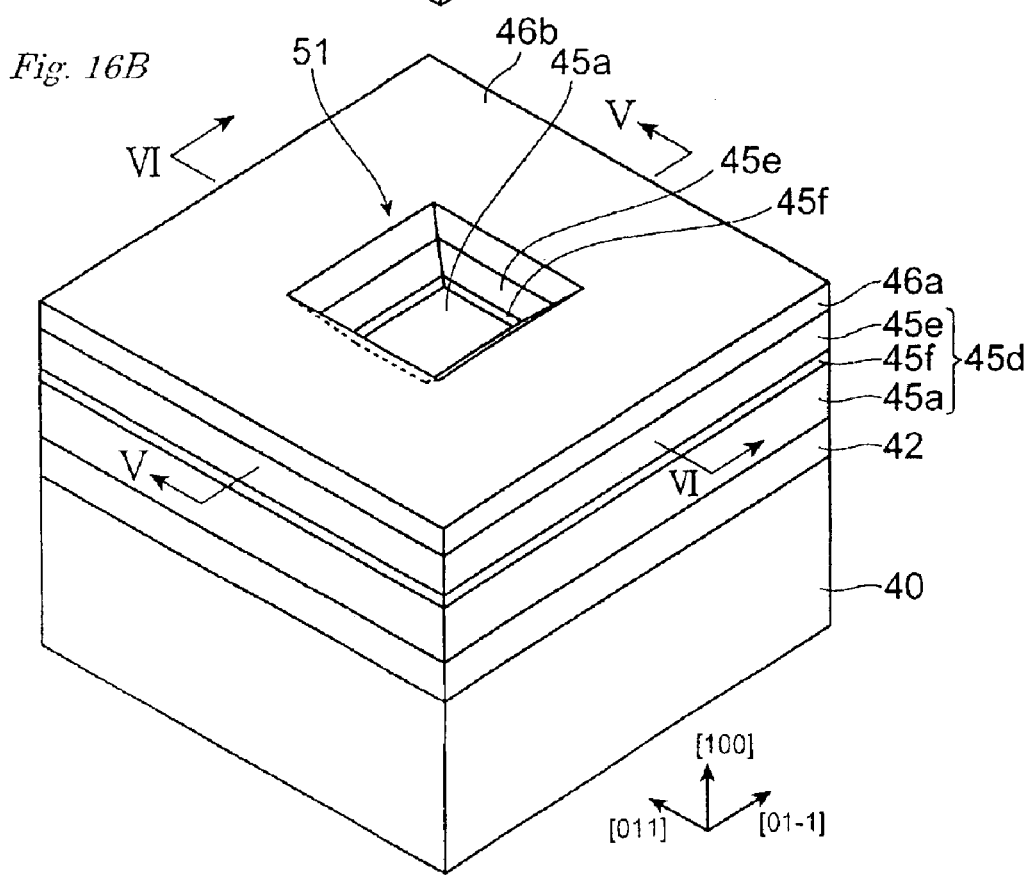

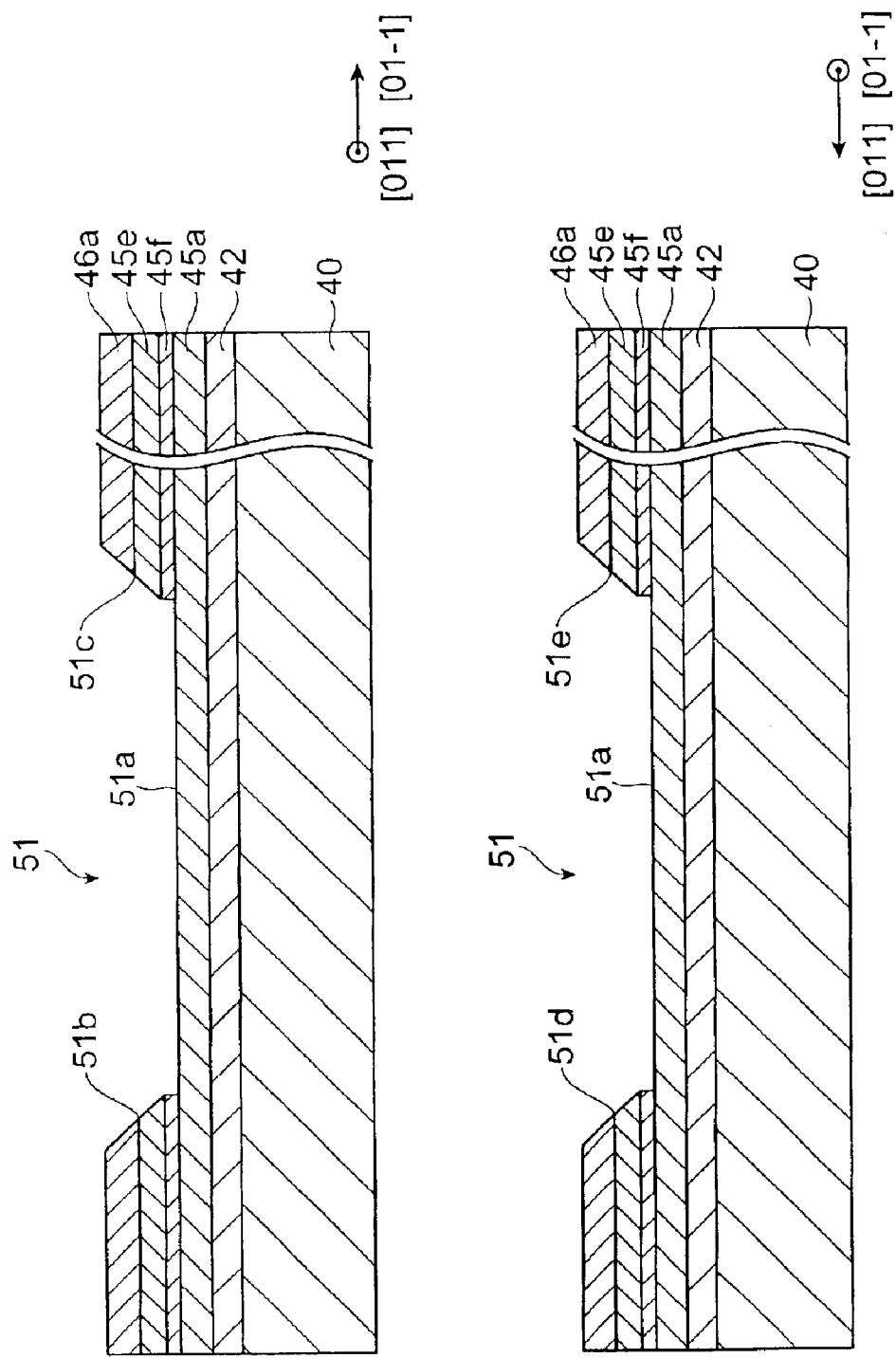

HETERO-JUNCTION BIPOLAR TRANSISTOR AND A METHOD FOR MANUFACTURING THE SAME

BACKGROUND OF THE INVENTION

1. Field of the Invention

This invention relates to a hetero-junction bipolar transistor (HBT) and a manufacturing process of the hetero-junction bipolar transistor.

2. Related Prior Art

The HBT has an emitter with a greater band gap than that of a base. Because of its high injection efficiency for the emitter, the HBT shows a large current gain and an excellent high frequency performance, such as a current switching characteristic.

It is necessary for further improving of the high frequency performance of the HBT to reduce both the base resistance rbb' and the base-collector capacitance Cbc. To decrease the base resistance rbb', it is effective to increase the carrier concentration and the thickness of the base layer. Increasing of the thickness of the base layer decreases not only the resistance of the layer itself but also the contact resistance between the base layer and the base electrode. On the other hand, to decrease the base-collector capacitance Cbc, it is necessary to decrease the carrier concentration of the base layer and the collector layer, which expands a depletion layer formed at the interface between the base layer and the collector layer. The expanded depletion layer isolates the holes in the base layer and the electrons in the collector layer to each other so as to weaken a coulomb interaction therebetween, thereby reducing the capacitance.

However, to increase the base layer results in the inferior current gain. Further, since the relation of the carrier concentration of the base layer and that of the collector layer is contradictory, it will be hard to find a consistent condition thereof. Therefore, an object of the present invention is to provide an improved structure in which both the base resistance and the base-collector capacitance are decreased, and to provide a method for manufacturing thereof.

SUMMARY OF THE INVENTION

According to one aspect of the present invention, a hetero-junction bipolar transistor comprises a collector layer, an extrinsic base layer, an intrinsic base layer and an emitter layer. The collector layer includes an inner collector region and an outer collector region. A thickness of the outer collector region is greater than that of the inner collector region. The extrinsic base layer is disposed on the collector layer in the outer collector region. The intrinsic base layer is made of a first semiconductor material and disposed on the extrinsic base layer in the outer collector region and disposed on the collector layer in the inner collector region. The emitter layer is made of a second semiconductor material and disposed on the intrinsic base layer, the band gap energy of which is greater than that of the first semiconductor material of the intrinsic base layer.

The HBT of the present invention has the intrinsic base layer in the inner collector region and the extrinsic base layer in the outer collector region. Further, the thickness of the outer collector region is greater than that of the inner collector region. Therefore, the resistance of the extrinsic base layer and the parasitic capacitance between the base and the collector can be reduced without compensating the current gain of HBT.

The HBT of the present invention preferably provides a supplemental semiconductor between the extrinsic base layer and the intrinsic base layer in the outer collector region, and between the collector layer and the intrinsic base layer in the inner collector region. The supplemental semiconductor layer can compensate an influence of an impurity derived from tools made of silica set within a reaction apparatus and piled up at the exposed surface of the extrinsic base layer. The supplemental layer is preferably same conduction type and a same material as that of the collector layer, thereby preventing the deterioration of the current gain.

Since the HBT of the present invention preferably has the emitter layer covering the intrinsic base layer, the edge of the emitter layer is apart from the edge of the emitter contact layer. The depletion layer formed at the edge of the emitter layer is prevented to expand to the edge of the emitter contact layer, which prevent the deterioration of the current gain of the HBT.

The present HBT preferably has a sub-collector layer between a semi-insulating substrate and the collector layer with a carrier concentration greater than that of the collector layer. A collector electrode is formed on the sub-collector layer. Since the carrier concentration of the sub-collector layer is so large as the carrier concentration of the collector layer is left low, the contact resistance of the collector electrode is enough small, whereby the resistance of the collector and the base-collector capacitance are reduced and the high frequency performance is enhanced.

The present HBT preferably has configuration that the outer collector region surrounds the inner collector region. Since the outer collector region surrounds the inner collector region where an operation of the transistor depends thereof, the edge of the intrinsic base layer does not appear on the inner collector region, which prevent the deterioration of the current gain.

Further, the present HBT preferably includes the collector layer comprising a first collector layer made of a first semiconductor material with a first thickness, a second collector layer made of a second semiconductor material, and a third collector layer. The inner collector region includes the first collector layer, while the outer collector region includes the first collector layer, the second collector layer, and the third collector layer.

In this configuration, since the thickness of the inner collector region precisely and independently determines the thickness of the collector layer, the base resistance rbb' and the base-collector capacitance can be reduced without compensating the current gain of the HBT, whereby enhancing the high frequency performance.

The HBT preferably has a semi-insulating InP substrate, a collector layer and a base layer both made of InGaAs lattice matched to the InP substrate, and an emitter layer made of InP.

Another aspect according to the present invention provides a manufacturing method of an HBT with a greater band gap energy of the emitter than that of the base. The method comprises: a) growing epitaxially a collector layer and an extrinsic base layer on a semi-insulating semiconductor substrate; b) etching a portion of the extrinsic base layer and a portion of the collector layer so as to form an inner collector region with a first thickness; and c) growing epitaxially an intrinsic base layer, an emitter layer and an emitter contact layer.

The method has the etching for the portion of the extrinsic base layer and the portion of the collector layer between the first epitaxial growth and the second epitaxial growth so as to form a first collector region with a first thickness. The intrinsic base layer is disposed directly on the collector layer without intervening the extrinsic base layer in the inner collector region, and the thickness of the collector layer in the outer collector region is left as the original thickness, which is thicker than that in the inner collector region. Therefore, the base-collector parasitic capacitance can be effectively reduced.

The method preferably comprises a growth of a supplemental semiconductor layer prior to the growth of the intrinsic base layer. Impurities from tools of the growing apparatus pile on the surface of the wafer, which occurred after growing the first group of layers and also after setting the semiconductor wafer, on which the second growth will be performed, into the growing apparatus. The supplemental layer grown prior to the second growth can prevent the influence of the impurity layer unavoidably intervened on the wafer.

The method of the present invention preferably comprises the step of growing a sub-collector layer prior to the growth of the collector layer. Since the sub-collector layer has a carrier concentration greater than that of the collector layer. A collector electrode is formed on the sub-collector layer, the base-collector parasitic capacitance can be effectively reduced, thus enhances the performance of the HBT.

The method of the present invention preferably further comprises the step of growing an emitter contact layer after the growth of the emitter layer. Since carrier concentration of the emitter contact layer is greater than that of the emitter layer, moreover, the energy band gap of the emitter contact layer is preferably smaller than that of the emitter layer, the contact resistance of the emitter electrode can be effectively reduced, whereby the high frequency performance of the HBT is enhanced.

In the method of the present invention, the growth of the collector layer preferably comprises a sequential growth of a first collector layer made of a first semiconductor material, a third collector layer made of a second semiconductor material, and a second collector layer. Further, the step of the etching preferably comprises a first etching and a second etching sequentially performed thereafter. The first etching etches the extrinsic base layer and the second collector layer selectively to the etch-stopping layer. The second etching etches the etch-stopping layer selectively to the first collector layer and the portion of the first collector layer.

Since the first collector layer and the second collector layer sandwiches the etch-stopping layer therebetween, and two step etching is performed for forming the inner collector region, the thickness of the inner collector region is precisely and independently determined on the outer collector region. This reduces both the base resistance rbb' and the base-collector parasitic capacitance without the compensation of the current gain of the HBT, whereby enhances the high frequency performance.

The HBT of the present invention preferably contains zinc atoms as the dopant of the extrinsic base layer, while contains carbon atoms as that of the intrinsic base layer. Since the intrinsic base layer contains carbon atoms, the solid solubility limit of which is greater than that of zinc atoms, the carrier concentration of the intrinsic base layer can be kept high even if the thickness thereof relatively thinner than that of the extrinsic base layer.

BRIEF DESCRIPTION OF DRAWINGS

FIGS. 4A and 4B show sectional views according to the second embodiment of the present invention;

FIGS. 5A and 5B are perspective view showing a manufacturing step of the hetero-junction bipolar transistor;

FIGS. 7A and 7B are sectional view showing a manufacturing step of the bipolar transistor;

FIGS. 11A and 11B are sectional views of the manufacturing step of the transistor subsequently to FIG. 10;

FIGS. 12A and 12B are sectional view of the manufacturing step of the transistor subsequently to FIG. 11A and FIG. 11B;

FIGS. 13A and 13B are sectional view of the manufacturing step subsequently to FIG. 12A and FIG. 12B;

FIGS. 14A and 14B are sectional view of the manufacturing step subsequently to FIG. 13A and FIG. 13B;

FIGS. 15A and 15B are sectional view of the manufacturing step subsequently to FIG. 14A and FIG. 14B;

FIGS. 16A and 16B are perspective view showing the manufacturing step of the bipolar-transistor according to another embodiment; and FIG. 17A is a sectional view taken along the line V—V in FIG. 16B, and FIG. 17B is a sectional view taken along the line VI—VI in FIG. 16B.

DETAILED DESCRIPTION OF THE INVENTION

Figure 1:
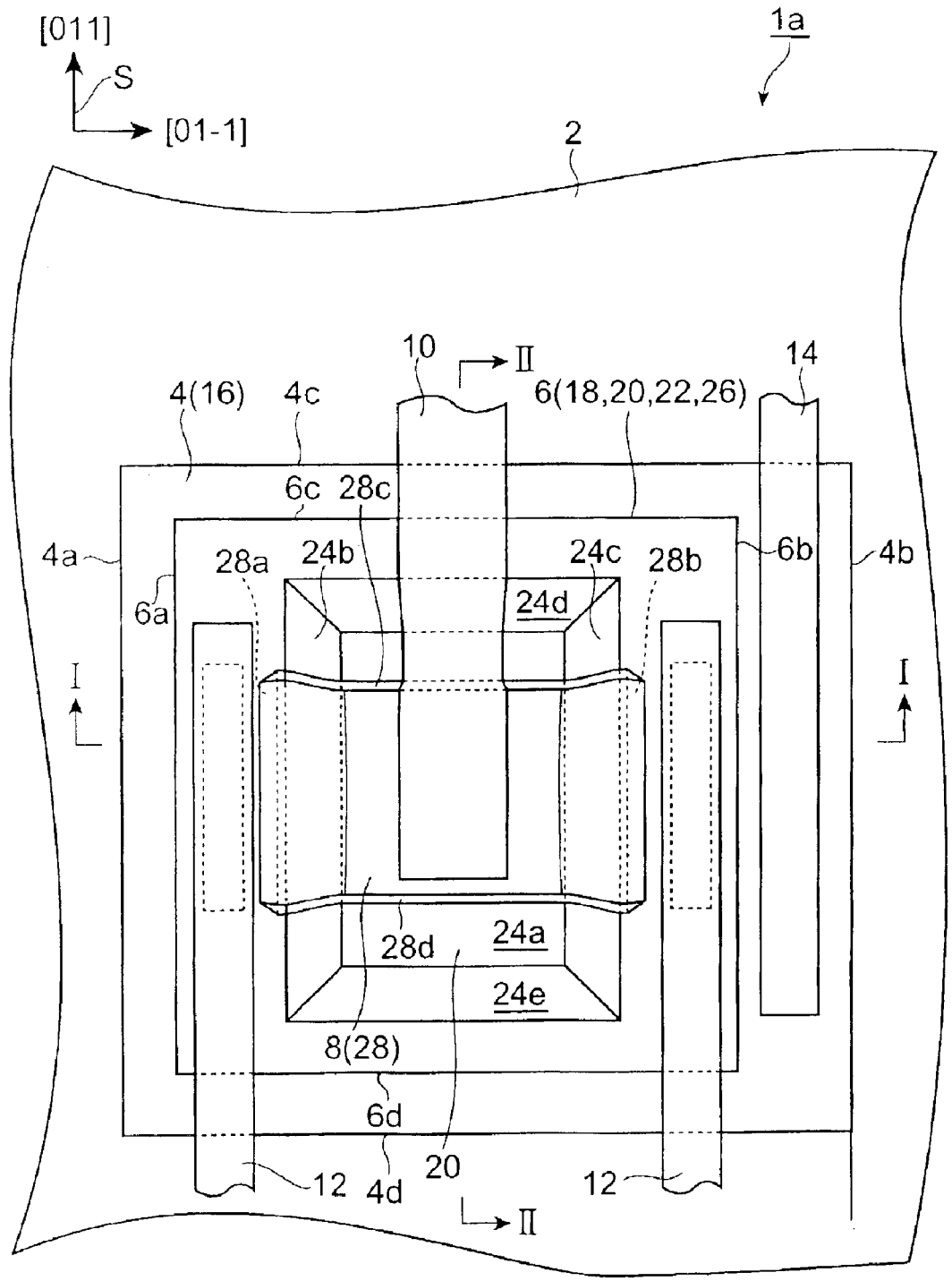
FIG. 1 is a plan view showing the first embodiment of the hetero-junction bipolar transistor according to the first embodiment.

The preferred embodiments of the present invention will be described. Elements identical to each other will be referred to with numerals identical to each other without overlapping explanations. In the drawings, dimensions such as the thickness of semiconductor layers will not always reflect their explanation.
(First Embodiment)

FIG. 1 is a plan view showing a hetero-bipolar transistor (herein after denoted by HBT) of the first embodiment, FIG. 2A is a sectional view taken along the line I—I and FIG. 2B is another sectional view taken along the line II—II in FIG. 1, respectively. According to the HBT 1a of the present embodiment is an npn-type transistor made of group III-V compound semiconductor materials and has the emitter layer with a band gap energy greater than that of the base layer.

Figure 2:
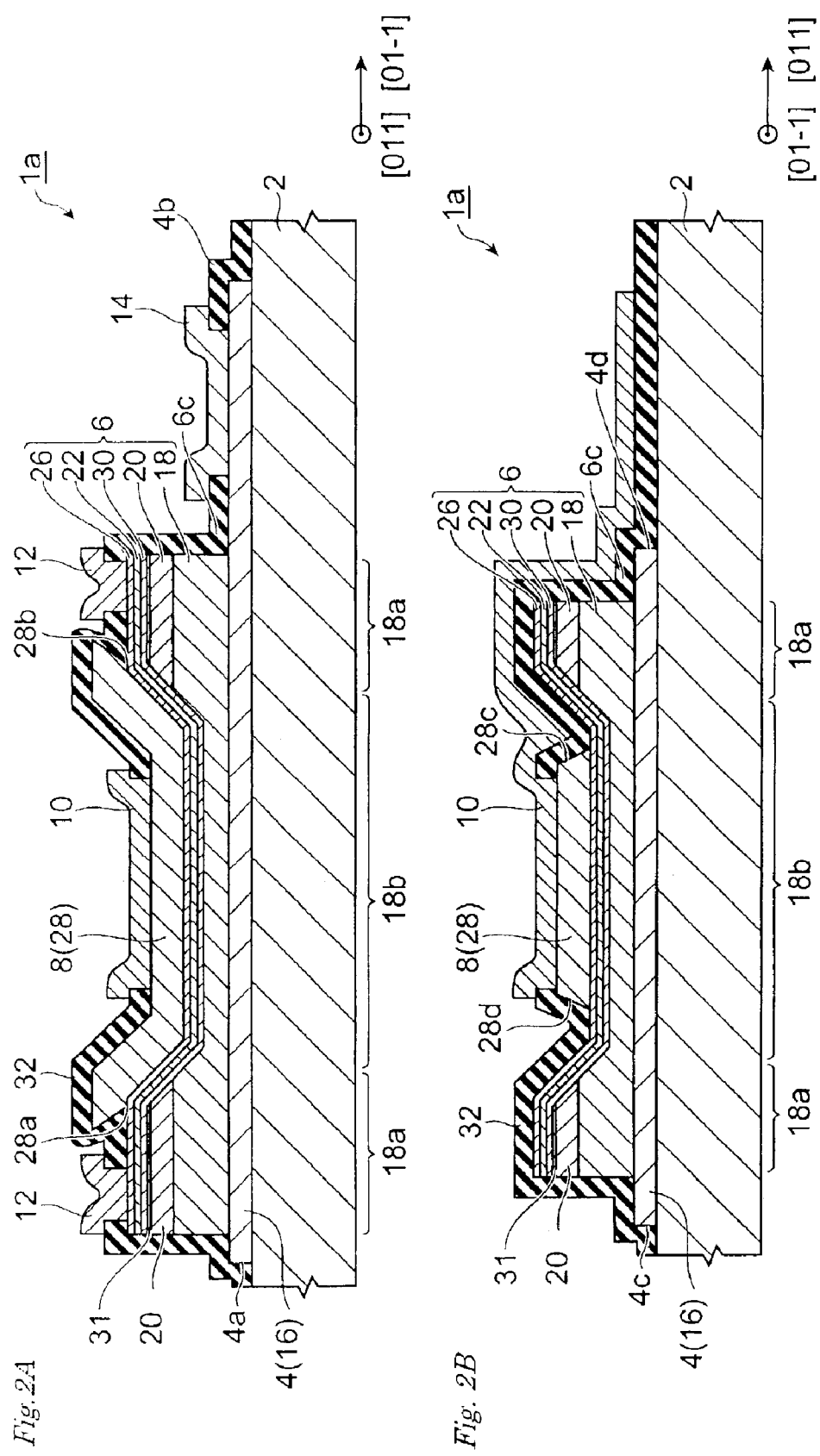
FIG. 2A is a sectional view taken along the line I—I in FIG. 1.
FIG. 2B is a sectional view taken along the line II—II in FIG. 1.

As shown in FIG. 1 and FIG. 2, the HBT 1a comprises a substrate 2, a first mesa 4, a second mesa 6, a third mesa 8, an emitter electrode 10, a base electrode 12, and a collector electrode 14. FIG. 1 also shows some arrows S that denote crystal orientations of the substrate. The substrate 2 is made of a semi-insulating InP with a (100) primary surface.

The structure of the HBT 1a will be described as referring to FIG. 1 and FIG. 2. The first mesa 4, disposed on the primary surface of the substrate, contains a sub-collector layer 16. The first mesa has a pair of side surfaces 4a, 4b that extend along the [011] orientation and another pair of side surfaces 4c, 4d along the [01-1] orientation. A primary surface of the first mesa 4 has a first portion and a second portion surrounding the first portion. The collector electrode 14 is formed on the second portion and extends along the [011] orientation so as to traverse the side surface 4c of the first mesa 4.

The second mesa 6 is formed on the first portion, which contains a collector layer 18, an extrinsic base layer 20, and an intrinsic base layer 22. The second mesa has a pair of side surface 6c, 6d that extends along the [01-1] orientation. A primary surface of the second mesa 6 also has a first portion and a second portion surrounding the first portion. A base electrode 12 is formed on the second portion of the second mesa 6 and traverses the side surface 4d of the first mesa 4 and also the side surface 6d of the second mesa 6.

A recess 24 is formed in the first portion of the second mesa 6. The recess 24 has a pair of side surface 24b, 24c that extends along the [011] orientation, and another pair of side surface 24d, 24e extending along [01-1] orientation. As shown in FIG. 2A and FIG. 2B, the side surfaces 24b to 24e of the recess are inclined to both the primary surface and the bottom surface 24a of the recess in an obtuse angle.

The collector layer 18 is formed on the sub-collector layer 16 and the extrinsic base layer 20 is formed on the collector layer 18. The recess 24 reaches to the collector layer from the primary surface of the second mesa 6 with piercing the extrinsic base layer 20, which exposes the collector layer 18 on the bottom surface thereof, and also the collector layer 18 and the extrinsic baser layer 20 on the side surfaces of the recess. The intrinsic base layer 22 is disposed on the primary surface of the second mesa 6, the respective side surfaces 24b to 24e, and the bottom surface 24a of the recess.

An emitter layer 26 is contained in the second mesa 6 and is formed on the intrinsic base layer 22. The emitter layer 26 entirely covers the intrinsic baser layer 22.

The third mesa 8 is disposed on the second mesa 6 and contains an emitter contact layer 28. The emitter contact layer 28 is formed in a region of the bottom surface 24a and also in a region of the side surfaces 24b, 24c of the recess 24. Further, the emitter contact layer 28 covers not only the first portion but also the second portion of the second mesa 6. The emitter contact layer 28 has a pair of side surfaces 28a, 28b that extends along the [011] orientation and another pair of side surfaces 28c, 28d that extends along the [01-1] orientation. The side surfaces 28c, 28d of the emitter contact layer have a normal trapezoid shape. The third mesa is called as an emitter contact mesa.

An emitter electrode 10 connected to the emitter contact layer 28 and extends along the [011] orientation as traversing the side surface 28c of the emitter contact layer, the side surface 6c of the second mesa 4, and also the side surface 4c of the first mesa 4.

As shown in FIG. 2A and FIG. 2B, the collector layer 18 comprises an inner collector region 18a and an outer collector region 18b. Only the inner collector region forms the recess 24. A thickness of the inner collector region 18a is thinner than that of the outer collector region 18b. On the outer collector region 18b, the intrinsic base layer 22 and the extrinsic base layer 20 are disposed, while only the intrinsic base layer 22 is formed on the inner collector region 18a. The emitter layer 26 is sandwiched by the intrinsic base layer 22 and the emitter contact layer 28, whereby the emitter contact layer 28 covers and protects the intrinsic base layer 22. This enables that the edge of the emitter layer 26 is apart from the edge of the emitter contact layer 28. Therefore, a depletion region formed at the edge of the emitter layer 26 does not influence the emitter contact layer 28.

The extrinsic base layer 20 and the collector layer 18 appear on side surfaces of the second mesa. As shown in FIG. 2A, the extrinsic base layer 20 and the intrinsic base layer 22 are formed between the emitter contact layer 28 and the collector layer 18 on the slant surface of the recess 24 and also on the second region of the second mesa 6. On the other hand, only the intrinsic base layer 22 is sandwiched by the emitter contact layer 28 and the collector layer 18 at on the side surface and the bottom of the recess 24. In FIG. 2B, the intrinsic base layer 22 locates between the emitter contact layer 28 and the collector layer 18 at the bottom of the recess 24.

A typical configuration of the HBT according to the present invention will be shown in the following table.

TABLE 1

Typical configuration of respective layers

| Layer | Material | Thickness (nm) | Dopant | Carrier Concentration (cm$^{-3}$) |
|---|---|---|---|---|
| Substrate 2 | InP | | | S.I. |
| Sub-Collector 16 | InGaAs | 300 | Si | $2.0 \times 10^{19}$ |
| Collector 18 | InGaAs | 800 | — | |
| Extrinsic Base 20 | InGaAs | 300 | Zn | $2.5 \times 10^{19}$ |
| Intrinsic Base 22 | InGaAs | 50 | C | $3.0 \times 10^{19}$ |
| Emitter 26 | InP | 10 | Si | $4.0 \times 10^{18}$ |
| Emitter Contact 28 | InGaAs | 250 | Si | $0.4{\sim}2.0 \times 10^{19}$ |

Figure 3:
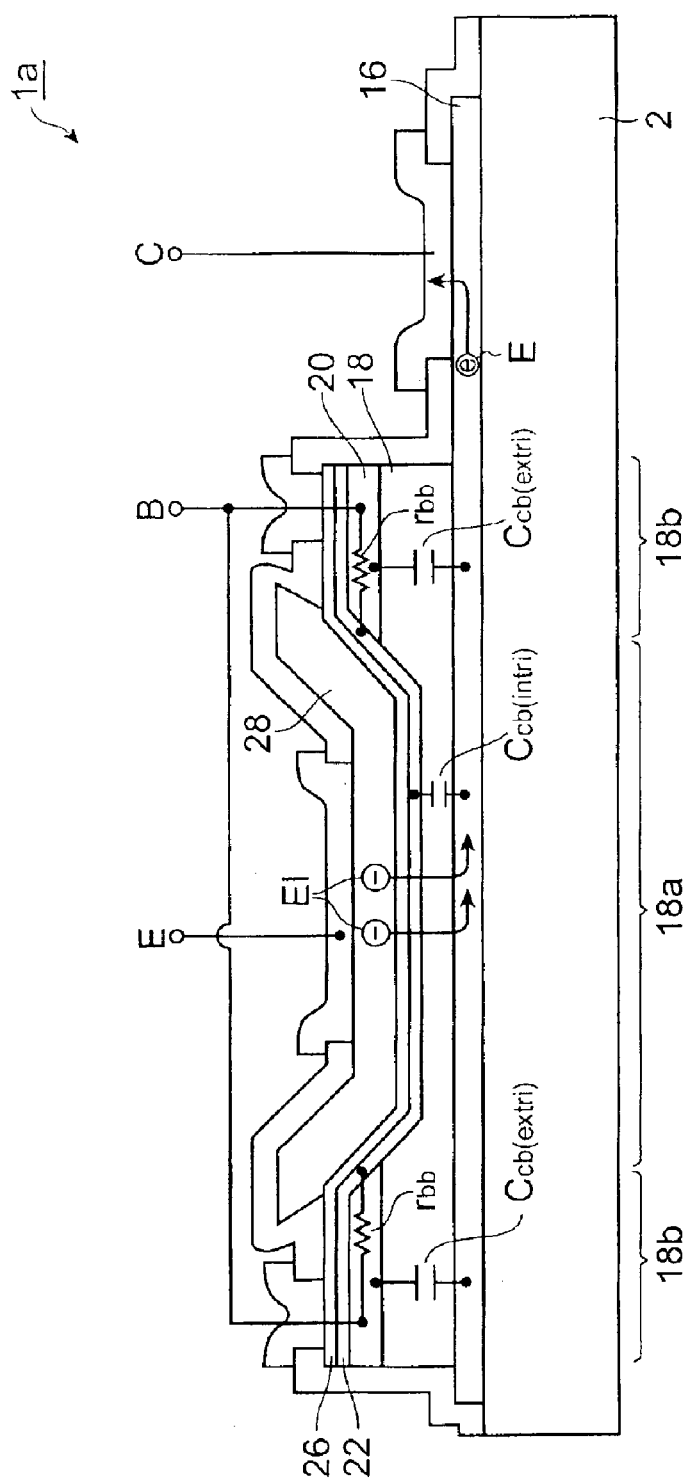
FIG. 3 shows an operation of the bipolar transistor.

Next, an operation of the HBT 1a will be described as referring to FIG. 3. The collector of the HBT 1a is divided into the inner collector region 18a and the outer collector region 18b. Since a thickness of the inner collector region 18a is thinner than that of the outer collector region 18b, a propagation time of carries EI from the emitter contact 28 to the sub-collector layer 16 is short as compared with the case that carriers propagates through the outer collector region. Since the carrier concentration of the sub-collector layer 16 is greater than that of the collector layer 18, the resistance of the sub-collector layer 16 is smaller than that of the collector layer 18. Further, a base-collector capacitance Cbc(ex) in the outer collector region is smaller than that Cbc(in) in the inner collector region because the thickness of the outer collector region 18b is greater than that of the inner collector region 18a. The HBT 1a provides the extrinsic base 20 on the outer collector region 18b, which enables to reduce a base resistance rbb' from the base electrode to the intrinsic base layer in the inner collector region 18a, thereby enhancing the current multiplication factor $\beta$.

Referring to FIG. 2A and FIG. 2B again, the HBT 1a has a supplemental semiconductor layer 30 between intrinsic base layer 22 and the extrinsic base layer 20. The supplemental semiconductor layer 30 improves a crystal quality of the intrinsic base layer 22. As explained later, a process for manufacturing the HBT 1a comprises a first epitaxial growth of the sub-collector layer, the collector layer and the extrinsic base layer, and a second epitaxial of the intrinsic base layer, the emitter layer, and the emitter contact layer after forming the recess 24. In such two step growth, silicon atoms caused by the tools, which are generally made of silica glass, may pile on the surface of the uppermost semiconductor layer grown at the first step. Since the silicon is an n-type dopant for the group III-V semiconductor, the carrier concentration of a p-type layer subsequent grown on the pile-up silicon may be reduced because a portion of p-type dopant contained in the subsequently grown layer are compensated with silicon. When the supplemental semiconductor layer 30 is provided on the extrinsic base 20, the intrinsic base layer with a predetermined hole concentration can be obtained because the supplemental layer 30 isolates the p-type dopant in the intrinsic base 20 from the pile-up silicon.

This supplemental semiconductor layer 30 is stacked between the extrinsic base 20 and the intrinsic base 22 at the outer collector region 18a, while this layer is between the collector 18 and the intrinsic base layer 22 at the inner collector region 18b. Because the recess 24 is formed in the inner collector region 18b after the first growth, the pile-up silicon is removed from the surface simultaneously with the recess formation. When the supplemental layer 30 is made of the same semiconductor material as that of the collector layer 18, the operation of the HBT 1a is not affected by the existence of the additional layer 30. The supplemental semiconductor layer 30 preferably comprises of an un-doped semiconductor, such as un-doped InGaAs, and a thickness of 20 nm.

(Second Embodiment)

FIGS. 4A and 4B show another embodiment of the present invention. FIG. 4A is a sectional view taken along the line I—I, while FIG. 4B is a sectional view along the line II—II in FIG. 1.

The HBT 1b has the same configuration with that of the HBT 1a except for the collector layer 19, which is formed instead of the collector layer 18. As shown in FIG. 4A and FIG. 4B, the collector layer 19 has an inner collector region 19a and an outer collector region 19b. The collector layer 19 comprises of a first 19c, a second collector layer 19d and a third collector layer 19e sandwiched by the first and the second collector layer. The first collector layer 19c does not affect the formation of the recess. As described in later of the specification, an etching characteristic of the second and the third collector layer are preferably different to each other for a specific etchant. It is able to etch the second collector layer 19d selectively to the third collector layer 19e. Therefore, the depth of the recess depends only on the thickness of the second collector 19d and the third collector layer 19e. On the other hand, the thickness of the collector layer in the inner collector region is defined by the thickness of the first collector layer 19c.

Next table 2 shows a typical configuration of respective collector layers.

TABLE 2

| Layer | Material | Thickness (nm) | Dopant | Carrier Concentration ($cm^{-3}$) |
|---|---|---|---|---|
| First Collector Layer 19c | InGaAs | 400 | un-dope | — |
| Second Collector Layer 19d | InGaAs | 400 | un-dope | — |
| Third Collector Layer 19e | InP | 20 | un-dope | — |

The second collector layer 19d is etched selectively to the third collector layer 19e by a solution of phosphoric acid, for example. Further, the third collector layer 19e is etched selectively to InGaAs by a solution of hydrochloric acid, for example.

(Third Embodiment)

Next, a method for manufacturing the HBT will be described as referring to figures from FIG. 5 to FIG. 15.

First Epitaxial Growth

In the first epitaxial growth step, a series of semiconductor layers made of III-V compound semiconductor materials are grown on a semiconductor substrate 40. As shown in FIG. 5A, a sub-collector layer 42, a collector layer 44, and an extrinsic base layer 46 are sequentially grown on the semi-insulating InP substrate 40 by using an Organic Metal Vapor Phase Epitaxy (OMVPE) technique. A doping concentration of the collector layer 44 is smaller than that of the sub-collector layer 42. Silicon (Si) is used for an n-type dopant to form the n-type sub-collector layer. The collector layer is an unintentionally doped III-V semiconductor layer, which is an n-type layer. The doping concentration of the sub-collector layer is determined to be considerably high, thereby lower the collector resistance of the HBT. The doping concentration and the thickness of the extrinsic base layer is so determined that base resistance rbb' is small enough. The zinc (Zn) is used for a p-type dopant of the extrinsic base layer 46 because of its high activation efficiency. The doping concentration and the thickness of the collector layer 44 is set so that the depletion layer formed by the junction between the base layer and the collector layer extends to the interface to the sub-collector layer 42.

Recess Formation

Figures 6A, 6B:
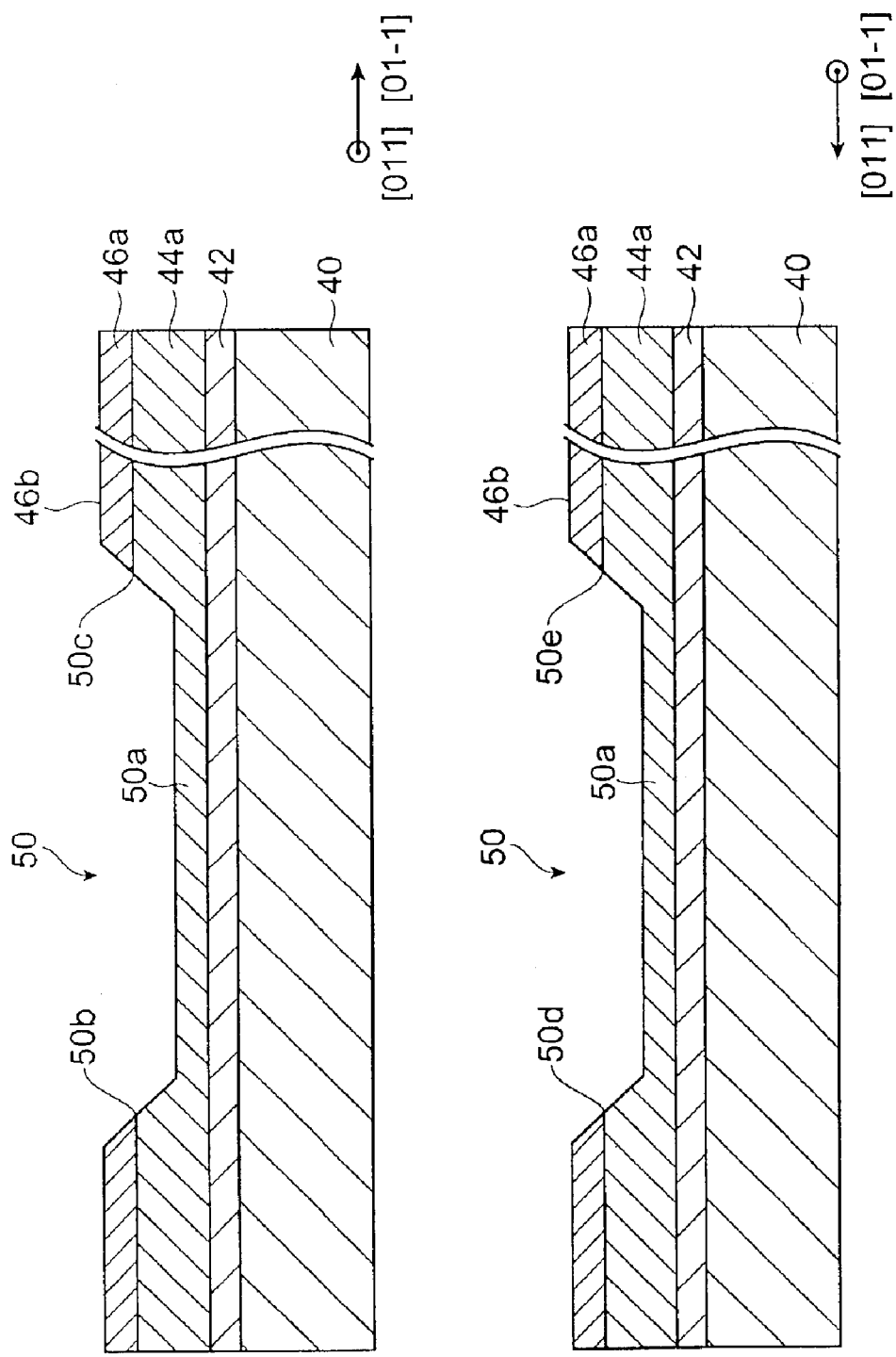
FIG. 6A is a sectional view taken along the line III—III in FIG. 5B.
FIG. 6B is a sectional view taken along the lint IV—IV in FIG. 5B.

Next, a mask 48 with an opening 48a corresponding to the recess is formed on the extrinsic base layer 46 as shown in FIG. 6A. The size of the opening is about 1.5 micron square in this embodiment, which depends on the size of the transistor, namely, the larger the current flowing in the transistor, the larger the size of the opening. The mask 48 is preferably made of inorganic materials such as silicon oxide ($SiO_2$), silicon nitride (SiN), or silicon oxy-nitride (SiON), or organic material such as photoresist. The opening has a pair of sides extending along [011] orientation and another pair of side along the [01-1] orientation.

The recess 50 is formed by the etching of the extrinsic base layer 44 and a portion of the collector layer 44. A mixture of sulfuric acid, hydrogen peroxide, and water can etch all of those layers. After the etching, the mask 48 is completely removed.

FIG. 6A is a sectional view taken along the line III—III in FIG. 5A, while FIG. 6B is that taken along the line IV—IV in FIG. 5B. The recess 50 has a bottom 50a, a pair of side surfaces 50b, 50c extending along the [011] orientation, and another pair of side surfaces 50d, 50e along the [01-1] orientation. The respective surfaces 50b to 50e have a shape of a normal trapezoid so as to connect the bottom 50a to the surface of the extrinsic base layer 46a. Both the extrinsic base layer 46a and the collector layer 44a appear at the respective side surfaces 50b to 50e of the recess 50. The thickness of the collector layer 50a at the bottom of the recess is about 400 nm, while the original thickness of the layer is about 800 nm.

Second Epitaxial Growth

A series of III-V semiconductor materials are epitaxially grown on the extrinsic base layer and in the recess at the second epitaxial growth. FIG. 7A is a sectional view taken along the line III—III in FIG. 5A, while FIG. 7B is that long the line IV—IV in FIG. 5B. An intrinsic base layer 54, an emitter layer 56 and an emitter contact layer 58 are sequential grown on the extrinsic base layer 46a and the recess 50. The OMVPE technique performs the growth of the layers. The doping concentration of the intrinsic base layer 56 is comparably large to reduce the base resistance, while the thickness of the intrinsic base layer 56 is so thin to obtain the high current multiplication factor β. The carbon is selected for the p-type dopant of the intrinsic base layer 54 because the intrinsic base layer is thinner than the extrinsic base layer 46 and the solid solubility limit of carbon is larger than that of zinc (Zn). The band gap energy of the emitter layer 56 is greater than that of the intrinsic base layer 54 and the emitter contact layer 58. Silicon is used as the n-type dopant for the emitter layer 56 and the emitter contact layer 58. The doping profile of the emitter contact layer 58 is preferably step-like or graded, namely, a portion of the emitter contact layer 58 close to the emitter layer 56 preferably has a higher doping concentration than that of another portion apart from the emitter layer 54. Typical configurations of two layers are that the emitter layer 56 is made of InP with a thickness of 20 nm and doping concentration of $4.0 \times 10^8$ cm$^{-3}$, while the emitter contact layer 58 is made of InGaAs with a thickness of 250 nm and a graded doping concentration from $4.0 \times 10^{18}$ cm$^{-3}$ to $2.0 \times 10^{19}$ cm$^{-3}$.

As mentioned previously, the supplemental semiconductor layer 52 is preferably grown on the extrinsic base layer 46 preceding the second epitaxial growth of semiconductor layers. The supplemental semiconductor layer 52 is preferably made of the same material as that of the collector layer 44 and has a doping concentration equivalent to or lower than that of the collector layer 44. Un-doped InGaAs is preferably used for the supplemental semiconductor layer 44.

The reason why the HBT of the present embodiment provides the supplemental layer 44 will be explained. The first epitaxial growth is performed by OMVPE or molecular beam epitaxy (MBE) technique. Since the apparatus used in these techniques generally contain tools made of silica glass, silicon atoms derived from silica glass adsorb the surface of the grown layer. The amount of the adsorption is estimated from $1.0 \times 10^{10}$ atoms/cm$^2$ to $1.0 \times 10^{11}$ atoms/cm$^2$. However, these silicon atoms distributes within a quite thin region, typically within a few atomic layer, the impurity concentration due to silicon atoms becomes as large as $1.0 \times 10^{17}$ atoms/cm$^3$, which is greater than the doping concentration of the collector layer 54. When the intrinsic base layer 54 is grown directly on the collector layer 44, unintentional layer containing silicon atoms is provided between the base layer and the collector layer, thereby compensates the p-type dopant in the base layer. The supplemental layer 52 prevents the compensation of the p-type dopant by silicon atoms. Moreover, the supplemental layer 52 prevents the reduction of the breakdown voltage between the base and the collector (Vbc) of the HBT due to the existence of silicon atoms.

Carbon is selector for the dopant of the intrinsic base layer 54 while the dopant for the extrinsic base layer 46 is zinc. The maximum solid solubility of carbon to InGaAs is about $4.0 \times 10^{19}$ atoms/cm$^2$ or greater, while that of zinc is limited to be about $2.0 \times 10^{19}$ atoms/cm$^2$. Therefore, carbon is used as the dopant of the intrinsic base layer with thinner thickness than that of the extrinsic base layer. Further, since a thermal diffusion co-efficient of carbon in InGaAs is smaller than that of zinc, a steep doping profile can be obtained. Zinc diffuses even at a temperature of 400° C., which is equal to the alloying temperature of the electrode formation. Thus, by using carbon as the p-type dopant, the HBT shows an excellent current amplification characteristic and a small saturation voltage Vbe, which is preferably for the HBT to apply to a logic circuit.

Emitter Contact Mesa Formation

Figure 8:
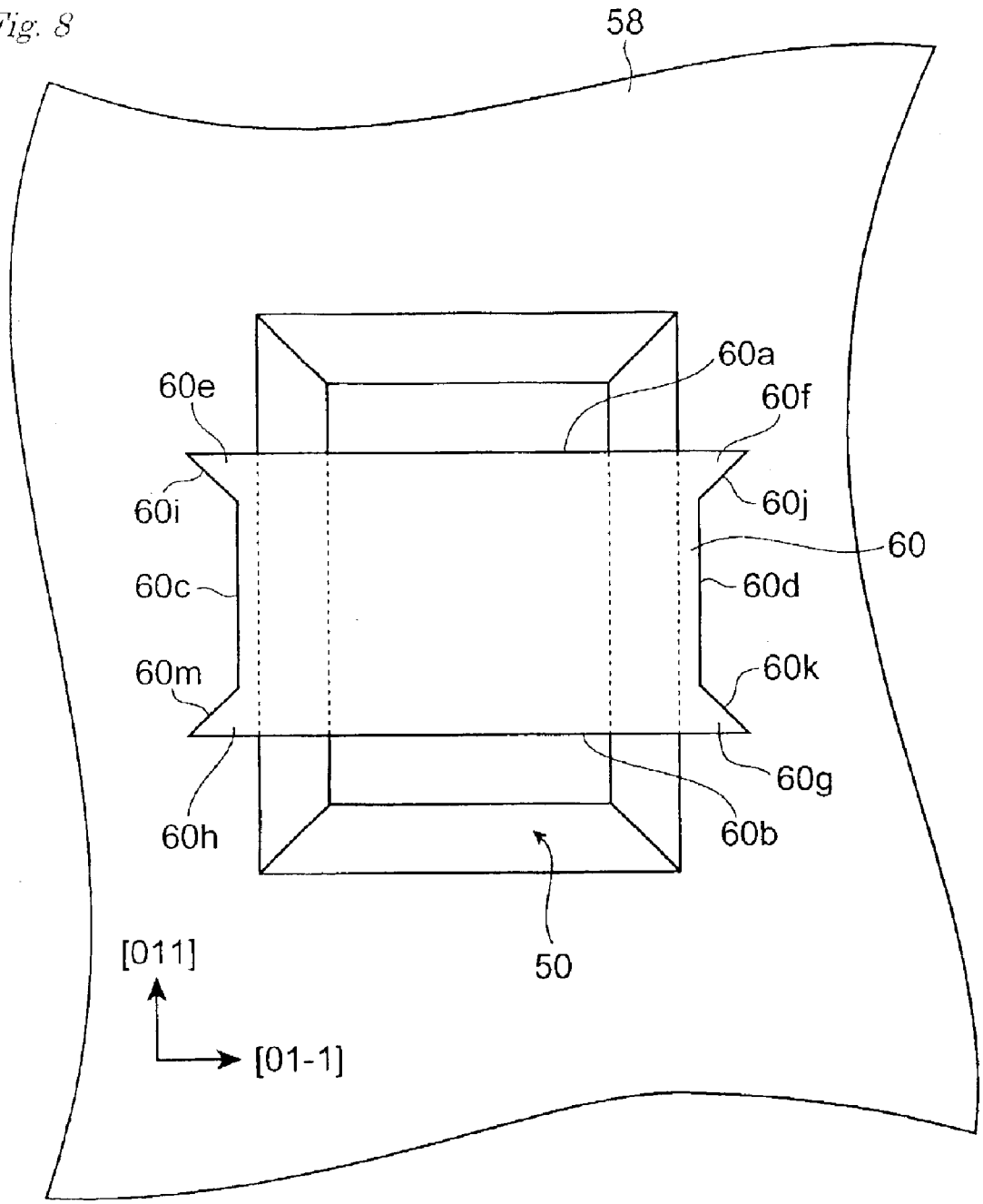
FIG. 8 is a plan view showing a mask for forming the emitter contact layer.
Figure 9A:
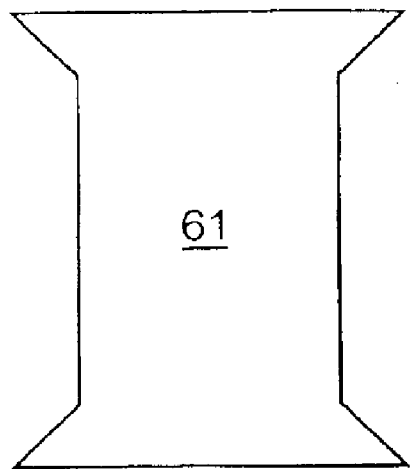
FIGS. 9A to 9D show variations of the mask for forming the emitter contact layer.
Figure 9B:
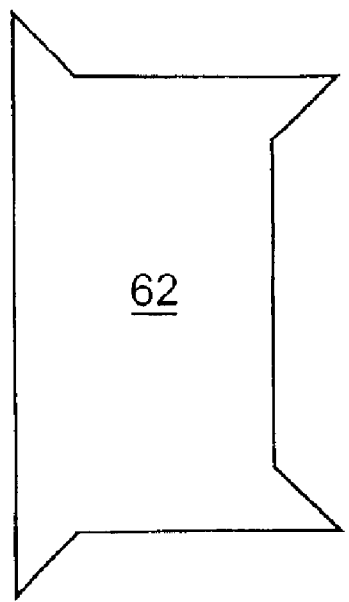
Figure 9C:
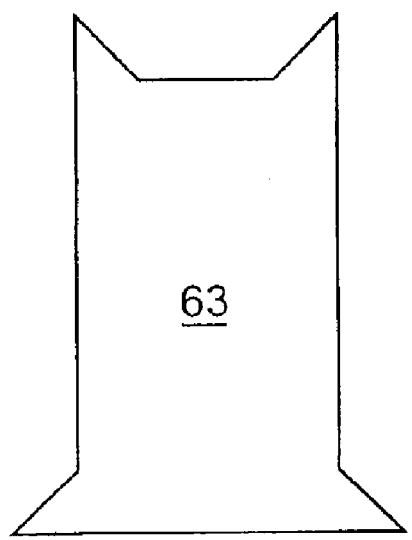
Figure 9D:
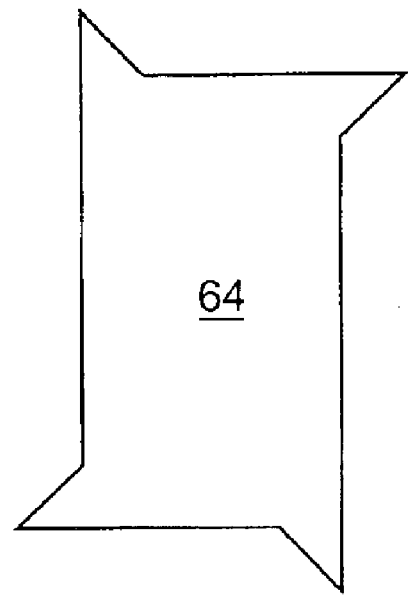

Next, the formation of the emitter contact mesa will be described as referring to FIG. 8. First, a mask 60 with substantially rectangle shape is formed on the emitter contact layer 58. The mask has a pair of sides 60a, 60b extending along the [01-1] orientation, and another pair of sides 60c, 60d along the [011] orientation. Further, the mask 60 has plural portions 60e to 60h protruding from the sides 60c, 60d. The respective portions has another side 60i to 60m, namely, the respective portions 60e to 60h are demarcated by sides 60a, 60b and additional sides 60i to 60m. Typical examples of the shape of the mask 60 are shown in figures from FIG. 9A to FIG. 9B. The respective examples shown in FIG. 9 have four primary sides and four protruding portion extending from some of the primary sides. The respective protruding portions are demarcated by one of the primary side and an additional side connecting the primary side to another side.

Referring again to FIG. 8, the emitter contact mesa is formed by the mask 60 as an etching mask. Using a mixture of phosphoric acid, hydrogen peroxide, and water performs a selective etching of the emitter contact layer of InGaAs to the emitter layer made of InP. The emitter layer functions as an etching stop layer. The mask 60 is removed after the etching.

Figure 10:
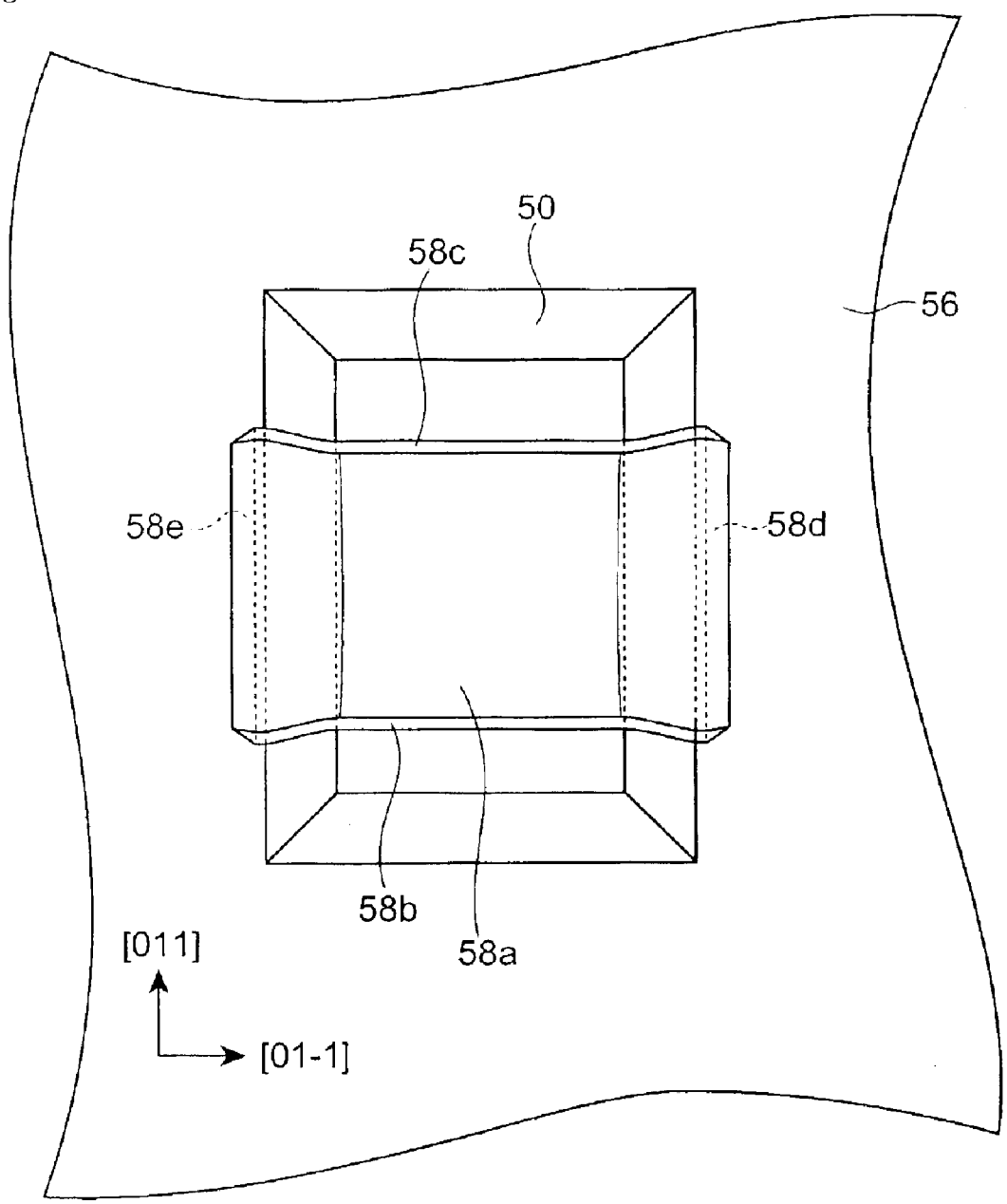
FIG. 10 is a plan view showing a manufacturing step of the transistor.

FIG. 10 is a plan view showing the emitter contact layer after the etching. The emitter contact layer 58a traverses the side surface of the recess 50, which is extending along the [011] orientation. The plane shape of the emitter contact mesa is not restricted to the embodiment shown in FIG. 10, for example, it may be applicable that the entire portion of the emitter contact layer locates within the recess.

As shown in FIG. 10, the plane shape of the emitter contact layer is substantial rectangle because the etching is performed by the mask 60 with plural protruding portions. The emitter contact layer 58a has a pair of side surfaces 58b, 58c extending along the [01-1] orientation and another pair of side surfaces 58d, 58e along the [011] orientation.

FIG. 11A is a sectional view taken along the line III—III in FIG. 5A, while FIG. 11B is a sectional view along the line IV—IV in FIG. 5B. In the present embodiment, because the emitter contact mesa is formed by the etchant containing phosphoric acid, the side surfaces 58b, 58c have a normal trapezoid, while another side surfaces 58d, 58e shows a reverse trapezoid.

Collector Mesa Formation

FIG. 12A is a sectional view along the line III—III in FIG. 5A, and FIG. 12B is another sectional view along the line IV—IV in FIG. 5B. After the emitter contact mesa formation, another mask 62 is formed on the emitter contact layer 58a and the emitter layer 56. The mask 62 has a shape that defines a region where the collector mesa will be formed. Next, the collector mesa formation will be described.

First, an etchant containing hydrochloric acid and water etch the emitter layer 56 made of InP selectively to InGaAs. Next, the intrinsic base layer 54, the supplemental semiconductor layer 52, the extrinsic base layer 46a, and the collector layer 44a are sequentially etched by another etchant containing sulfuric acid, hydrogen peroxide, and water. The second etching is performed so as to remove the layers listed above and to leave the substantial portion of the sub-collector layer 42. Therefore, the thickness of the sub-collector layer is so determined to take the etching into account.

Thus, these two step etching forms the collector mesa containing the collector layer 44b, the extrinsic base layer 44b, the supplemental semiconductor layer 52a, the intrinsic base layer 54a, and the emitter layer 56a. The mask 62 is removed after the mesa formation.

Sub-Collector Mesa Formation

Next, the formation of the sub-collector mesa will be described as referring to FIG. 13. FIG. 13A is a sectional view taken along the line III—III in FIG. 5A, while FIG. 13B is a view along the line IV—IV in FIG. 5B. The collector mesa 64 and the sub-collector layer 66 are covered by another mask 66 that defines a region of the sub-collector mesa. The mixture of hydrochloric acid and hydrogen peroxide etch the sub-collector layer made of InGaAs selectively to the InP substrate. Thus, the sub-collector mesa is formed, which contains the sub-collector layer 42a.

Passivation Layer Formation

After the formation of the sub-collector mesa, an insulating layer 70 made of an inorganic material, such as a SiN deposited by a plasma enhanced chemical vapor deposition technique, covers the entire surface of the substrate. As shown in FIG. 14A and FIG. 14B, the insulating layer is patterned based on the mask 72, which has openings on the sub-collector layer 42a, the emitter layer 56a, and the emitter contact layer 58a.

Electrode Formation

Electrodes are formed as follows. First, a mask 74 made of photoresist is patterned on the insulating layer 70. The mask 74 has openings corresponding to the collector electrode, the emitter electrode, and the base electrode. A stacked metal 76 of platinum, titanium, platinum and gold is deposited on the mask 72 and within the openings. After removing the mask 72 with those metals on the top thereof, the respective electrode of the collector, the emitter and the base are formed as shown in FIG. 15A and FIG. 15B. (Forth Embodiment) Another HBT with a modified configuration will be described, which differs from the previously described embodiment from the viewpoint of the structure of the collector layer.

First Epitaxially Growth

A sub-collector layer 42, a collector layer 45, and an extrinsic base layer 46 are grown on a semi-insulating InP substrate 40 by OMVPE technique. The collector layer 45 has an impurity concentration smaller than that of the sub-collector layer and the extrinsic base layer 46, which is preferably un-dope semiconductor layer. In the present embodiment, the collector layer comprises a plurality of semiconductor layers 45a to 45c. Typical configuration of the collector layer is shown in Table III.

TABLE III

| Layer | Material | Thickness (nm) | Dopant | Carrier Concentration ($cm^{-3}$) |
|---|---|---|---|---|
| First Collector Layer 45a | InGaAs | 400 | un-dope | — |
| Second Collector Layer 45e | InGaAs | 400 | un-dope | — |
| Third Collector Layer 45f | InP | 20 | un-dope | — |

Recess Formation

Next, a mask 48 with an opening 48a is formed on the extrinsic base layer 46 as shown in FIG. 16A. Similar etching process to the third embodiment for the formation of the recess is performed for the extrinsic base layer 46 and the third collector layer 45f. First, a mixture of phosphoric acid can etch these layers 46, 45e selectively to the un-dope third collector layer 45f. After the first etching, the third collector layer 45f appears in the bottom of the recess. Next, the third collector layer 45f made of InP is etched by an etchant of hydrochloric acid, which is capable to etch InP selectively to the un-dope InGaAs stacked beneath the InP layer. Thus two step etching forms a recess 51, the bottom 51a of which appears one of the collector layers 45a and both the extrinsic base layer 46a and two collector layer 45e, 45f are exposed on the side surface thereof.

FIG. 17A is a sectional view along the line V—V, while FIG. 17B is another sectional view along the line VI—VI in FIG. 16B. The recess 51 has the bottom 51a, a pair of side surfaces 51b, 51c extending along the [011] orientation, and another pair of surfaces 51d, 51e along [01-1] orientation. The respective side surfaces of the recess 51 have normal trapezoid so as to connect the bottom thereof to the top surface of the extrinsic base layer 46a. The extrinsic base layer 46a and two collector layers 45b, 45c appear on the respective side surfaces thereof. In the present embodiment, the thickness of the first collector layer 45a defines the thickness of the collector layer.

Following to the recess formation, a series of the manufacturing process similar to those described in the third embodiment are performed, thereby forms the HBT with the structure according to the present embodiment.

From the invention thus described, the invention and its application may be varied in many ways. For example, the thickness of the respective layers shown in figures is illustrative and may be arranged. Although the base electrode is disposed onto the emitter layer in embodiments, it is applicable to dispose windows to the emitter layer to form the base electrode directly onto the base layer. The embodiments show specific semiconductor materials and composition thereof for respective layers, the invention is not limited to such materials. Further, orientations of the crystal axis and the surface appeared in the description may include its equivalent. Such variations are not to be regarded as a departure from the spirit and scope of the invention, and all such modifications as would be obvious to one skilled in the art are intended for inclusion within the scope of the following claims.

What is claimed is:

1. A hetero-junction bipolar transistor comprising:
    a collector layer including an inner collector region with a first thickness and an outer collector region with a second thickness greater than the first thickness;
    an extrinsic base layer disposed on the collector layer of the outer collector region;
    an intrinsic base layer disposed on the extrinsic base layer in the outer collector region and on the collector layer in the inner collector region, the intrinsic base layer being made of a first semiconductor material with a first band gap energy; and
    an emitter layer made of a second semiconductor material with a second band gap energy greater than the first band gap energy, the emitter layer being disposed on the intrinsic base layer.

2. A hetero-junction bipolar transistor according to claim 1, further comprises a supplemental semiconductor layer disposed between the extrinsic base layer and the intrinsic base layer in the outer collector region, and disposed between the intrinsic base layer and the collector layer in the intrinsic collector region.

3. A hetero-junction bipolar transistor according to claim 2, wherein the supplemental semiconductor layer is made of a same semiconductor material with the collector layer.

4. A hetero-junction bipolar transistor according to claim 1, further comprises a sub-collector layer and a collector electrode formed onto the sub collector layer, the collector layer being disposed on the sub-collector layer, the sub collector layer having a carrier concentration greater than a carrier concentration of the collector layer.

5. A hetero-junction bipolar transistor according to claim 1, further comprises an emitter-contact layer disposed on the emitter layer and an emitter electrode formed on the emitter contact layer, a carrier concentration of the emitter contact layer being greater than a carrier concentration of the emitter layer and a band gap energy of the emitter contact layer being smaller than the second band gap energy.

6. A hetero-junction bipolar transistor according to claim 1, wherein the collector layer includes a first collector layer made of a first semiconductor material with the first thickness, a third collector layer made of a second semiconductor material, and a second collector layer with the second thickness, wherein the inner collector region contains the first collector layer and the outer collector region contains the first collector layer, the third collector layer, and the second collector layer.

7. A hetero-junction bipolar transistor according to claim 1, further comprises a semi-insulating InP substrate, wherein the collector layer and the base layer are made of InGaAs lattice matched to the InP substrate, and the emitter layer is made of InP.

* * * * *